United States Patent
Oberg et al.

(10) Patent No.: US 9,767,238 B2
(45) Date of Patent: Sep. 19, 2017

(54) RECIPROCAL QUANTUM LOGIC (RQL) CIRCUIT SIMULATION SYSTEM

(71) Applicants: Oliver T. Oberg, Elkridge, MD (US); Steven B. Shauck, Crofton, MD (US)

(72) Inventors: Oliver T. Oberg, Elkridge, MD (US); Steven B. Shauck, Crofton, MD (US)

(73) Assignee: Northrop Grumman Systems Corporation, Falls Church, VA (US)

( * ) Notice: Subject to any disclaimer, the term of this patent is extended or adjusted under 35 U.S.C. 154(b) by 163 days.

(21) Appl. No.: 14/799,172

(22) Filed: Jul. 14, 2015

(65) Prior Publication Data

US 2017/0017742 A1    Jan. 19, 2017

(51) Int. Cl.
   G06F 9/455 (2006.01)
   G06F 17/50 (2006.01)
(52) U.S. Cl.
   CPC ...... G06F 17/5031 (2013.01); G06F 17/5022 (2013.01); G06F 17/5045 (2013.01)
(58) Field of Classification Search
   USPC .......................................................... 716/114
   See application file for complete search history.

(56) References Cited

PUBLICATIONS

Dorojevets et al., "Towards 32-bit Energy-Efficient Superconductor RQL Processors: The Cell-Level Design and Analysis of Key Processing and On-Chip Storage Units", Jun. 2015, IEEE Transactions on Applied Superconductivity, vol. 25 No. 3, Article Sequence No. 1300408.*
International Search Report for corresponding PCT/US2016/040984, mailed Oct. 4, 2016.
Dorojevets, et al: "*Towards 32-bit Energy-Efficient Superconductor RQL Processors: The Cell-Level Design and Analysis of Key Processing and On-Chip Storage Units*"; IEEE Transactions on Applied Superconductivity, IEEE Service Center, Los Alamitos, CA, US, vol. 25, No. 3, Jun. 1, 2015; pp. 1-8, XP011568148, ISSN: 1051-8223, DOI: 10-1109/TASC.2014.2368354 [retrieved on Dec. 15, 2014]; Abstract, p. 1-2.

(Continued)

*Primary Examiner* — Bryce Aisaka
(74) *Attorney, Agent, or Firm* — Tarolli, Sundheim, Covell & Tummino LLP

(57) ABSTRACT

One example includes an RQL circuit simulation system. The system includes a circuit design tool that facilitates user inputs to design an RQL circuit design comprising at least one predetermined RQL circuit design component. The system also includes a memory system that stores the RQL circuit design and an RQL component library comprising predetermined RQL circuit design components from which the at least one predetermined RQL circuit design component is selected. Each of the predetermined RQL circuit design components includes predetermined RQL component metrics associated with performance of the respective one of the predetermined RQL circuit design components. The system also includes a circuit simulator configured to compile performance metrics associated with the RQL circuit design based on the predetermined RQL component metrics associated with the respective at least one of the predetermined RQL circuit design components and to simulate the RQL circuit design based on the performance metrics.

18 Claims, 3 Drawing Sheets

(56) References Cited

PUBLICATIONS

Herr, et al.: "*Ultra-Low-Power Superconductor Logic*"; Journal of Applied Physics, American Institute of Physics, US, vol. 109, No. 10, May 17, 2011, pp. 103903-1-103903-8, XP012146891, ISSN: 0021-8979, DOI: 10-1063/1.3585849; abstract, pp. 103903-1 through 103903-4, p. 103903-7.

Oberg: "*Superconducting Logic Circuits Operating with Reciprocal Magnetic Flux Quanta*"; Jan. 1, 2011, XP055197045, ISBN: 978-1-26-719284-4; Retrieved from the internet: URL:http://search.proquest.com/docview/923614769 [retrieved on Sep. 15, 2016]; p. 49; p. 82-83; p. 100-102; p. 109-120; p. 197, paragraph 1; p. 219-220. (In 8 parts.).

* cited by examiner

RECIPROCAL QUANTUM LOGIC (RQL) CIRCUIT SIMULATION SYSTEM

TECHNICAL FIELD

This disclosure relates generally to quantum and classical circuit systems, and specifically to Reciprocal Quantum Logic (RQL) circuit simulation system.

BACKGROUND

Circuit simulation is a manner for electronic circuits to be designed in a simulated manner and tested in a simulation environment for operational characteristics of the electronic circuits. Implementing circuit simulation can provide for a much more cost-effective and efficient way of testing circuit behavior, and thus for optimizing circuit design parameters. Typical simulated circuits can be complementary metal-oxide semiconductor (CMOS) circuits, such as to provide logic testing of the operation of the CMOS circuits. In CMOS circuits, combinatorial and sequential component building blocks can be included in a circuit simulation to verify logic success of the circuit and/or timing characteristics associated with the circuit. However, other types of circuits, such as superconducting circuit systems, are becoming more prevalent and can have entirely different operating characteristics. Superconducting circuit systems, such as Reciprocal Quantum Logic (RQL) circuits, do not operate with the same combinatorial and sequential classifications as CMOS circuits, and thus cannot be simulated in the same manner.

SUMMARY

One example includes an RQL circuit simulation system. The system includes a circuit design tool that facilitates user inputs to design an RQL circuit design comprising at least one predetermined RQL circuit design component. The system also includes a memory system that stores the RQL circuit design and an RQL component library comprising predetermined RQL circuit design components from which the at least one predetermined RQL circuit design component is selected. Each of the predetermined RQL circuit design components includes predetermined RQL component metrics associated with performance of the respective one of the predetermined RQL circuit design components. The system also includes a circuit simulator configured to compile performance metrics associated with the RQL circuit design based on the predetermined RQL component metrics associated with the respective at least one of the predetermined RQL circuit design components and to simulate the RQL circuit design based on the performance metrics.

Another embodiment of the invention includes a method for simulating an RQL circuit design. The method includes facilitating user inputs via a circuit design tool to design a plurality of predetermined RQL circuit design components and calculating predetermined RQL component metrics associated with each of the plurality of predetermined RQL circuit design components. The method also includes storing the predetermined RQL circuit design components and the associated predetermined RQL component metrics in an RQL component library and facilitating user inputs via the circuit design tool to design the RQL circuit design comprising at least one of the plurality of predetermined RQL circuit design components. The method further includes compiling aggregate performance metrics associated with the RQL circuit design based on the predetermined RQL component metrics associated with the respective at least one of plurality of predetermined RQL circuit design components and simulating the RQL circuit design via a circuit simulator based on the aggregate performance metrics.

Another embodiment of the invention includes an RQL circuit simulation system. The system includes a circuit design tool configured to facilitate user inputs to design an RQL circuit design comprising at least one predetermined RQL circuit design component. The system also includes a memory system configured to store the RQL circuit design and an RQL component library comprising a plurality of predetermined RQL circuit design components from which the at least one predetermined RQL circuit design component is selected. Each of the plurality of predetermined RQL circuit design components includes predetermined RQL component metrics. The predetermined RQL component metrics include timing data associated with at least one Josephson junction and timing behavior associated with single-flux quantum (SFQ) pulses associated with the respective one of the plurality of predetermined RQL circuit design components. The system also includes a circuit simulator that includes a performance metric compiler configured to evaluate the RQL circuit design and to access the RQL component library to compile aggregate performance metrics associated with the associated with the RQL circuit design based on the predetermined RQL component metrics associated with each individual one of the respective at least one of plurality of predetermined RQL circuit design components. The circuit simulator also includes a processor configured to simulate the RQL circuit design based on the aggregate performance metrics.

DETAILED DESCRIPTION

This disclosure relates generally to quantum and classical circuit systems, and specifically to Reciprocal Quantum Logic (RQL) circuit simulation system. The RQL circuit simulation system includes a circuit design tool configured to facilitate user inputs to design an RQL circuit design that can be simulated in the RQL circuit simulation system. The RQL circuit design can be stored in a memory system that can also store an RQL component library. The RQL component library can store a plurality of predetermined RQL circuit design components that each has associated predetermined RQL component metrics. The predetermined RQL circuit design components can have been designed via the circuit design tool, and can include Josephson transmission lines (JTLs) and/or RQL gates (e.g., superconducting logic gates). For example, the predetermined RQL circuit design components can be provided to a circuit simulator for a calculation of the RQL component metrics. For example, the RQL component metrics can include timing data associated with at least one Josephson junction and/or timing behavior of single-flux quantum (SFQ) pulses associated with each of the respective predetermined RQL circuit design components.

The RQL circuit design can be accessed by the circuit simulator for simulation of the operational characteristics of the RQL circuit design. The circuit simulator can include a performance metric compiler configured to evaluate the RQL circuit design to determine the RQL circuit design components associated with the RQL circuit design, and can access each of the predetermined RQL circuit design components from the RQL component library to compile aggregate performance metrics associated with the RQL circuit design. Thus, the circuit simulator can simulate the RQL circuit design via a processor based on the aggregate performance metrics, such as to determine operational behavior and/or logic success of the RQL circuit design. The circuit simulator can provide the simulation results to the circuit design tool, such that the circuit design tool can receive additional user inputs to provide optimization of the RQL circuit design in a feedback manner.

Figure 1:
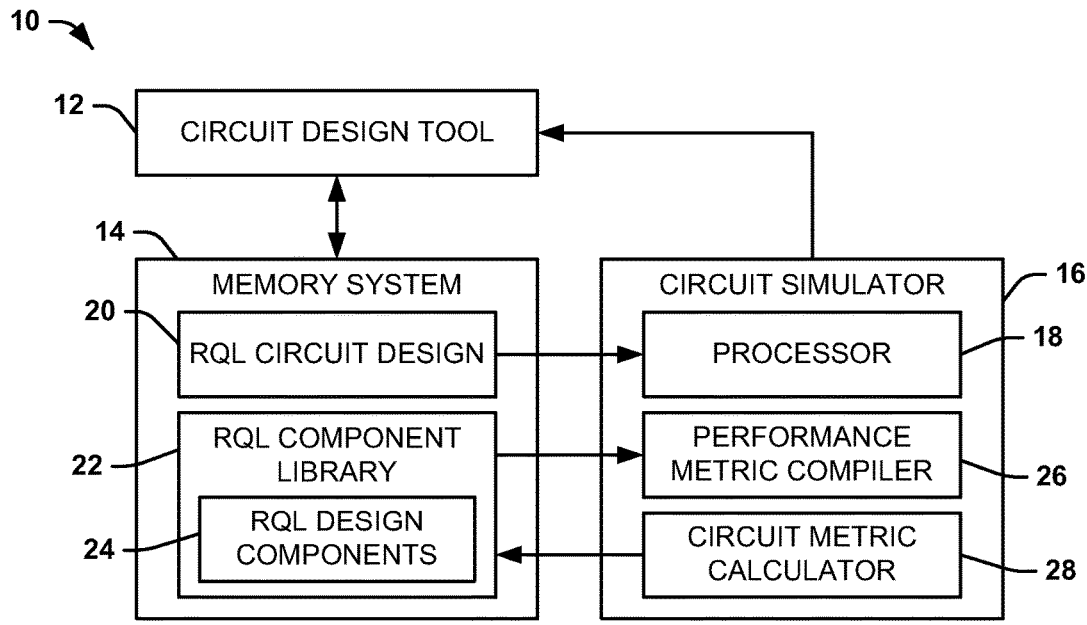
FIG. 1 illustrates an example of an RQL circuit simulation system.

FIG. 1 illustrates an example of a Reciprocal Quantum Logic (RQL) circuit simulation system 10. The RQL circuit simulation system 10 can be implemented for designing and simulating circuits, such as complementary metal-oxide semiconductor (CMOS) circuits, Reciprocal Quantum Logic (RQL) circuits, or a combination of both.

The RQL circuit simulation system 10 includes a circuit design tool 12, a memory system 14, and a circuit simulator 16. The circuit design tool 12 can be configured as any of a variety of types of user interfaces for receiving user inputs to design circuits, such as a computer, a dedicated workstation, an Internet portal, a graphical user interface (GUI), or any of a variety of other types of user interfaces. For example, the circuit design tool 12 can be configured as a circuit synthesis tool (e.g., commercially available) configured to design CMOS and/or RQL circuits, such as based on behavioral Register Transfer Level (RTL) code, VHSIC Hardware Description Language (VHDL) code, or Verilog code. The memory system 14 can be configured as a memory device or an arrangement of multiple memory devices that are configured to store data, such as in an associated computer system that includes the circuit design tool 12. The circuit simulator 16 is configured to simulate circuits that are designed via the circuit design tool 12, such as including classical computing circuit systems (e.g., CMOS circuits) and quantum computing circuit systems (e.g., RQL circuits). The circuit simulator 16 can be configured, for example, as a software component that is executed by a processor 18 and stored in the memory system 14, or can be configured as an application specific integrated circuit (ASIC) or as part of an ASIC. As an example, the circuit simulator 16 can be configured as a physical circuit simulation engine, a logical circuit simulation engine, or a combination thereof.

In the example of FIG. 1, the circuit design tool 12 can be configured to facilitate user inputs to design an RQL circuit design 20 that is stored in the memory system 14. The RQL circuit design 20 can correspond to a collection of quantum computing components and a collection of classical computing components with which the quantum computing components can interact. For example, the RQL circuit design 20 can include one or more Josephson transmission lines (JTLs) that interconnect one or more RQL gate circuits that are configured to perform logic operations, such as based on a sequence of single-flux quantum (SFQ) pulses. As another example, the circuit design tool 12 can be configured to design an RQL circuit design component, such that it can constitute a portion of a larger RQL circuit design 20, and thus a larger overall circuit. As described herein, the term "RQL circuit design component" describes a circuit component that is a building-block of a larger circuit, such that a larger functional RQL circuit (e.g., the RQL circuit design 20) is composed of a plurality of predetermined RQL circuit design components coupled together to provide the composite function of the larger functional RQL circuit.

The memory system 14 also stores an RQL component library 22 that is configured to store a plurality of predetermined RQL circuit design components 24. For example, the predetermined RQL circuit design components 24 can have been designed via the circuit design tool 12 and stored in the RQL component library 22 for the purpose of designing the RQL circuit design 20 based on a combination of predetermined RQL circuit design components 24 in the RQL component library 22. The RQL component library 22 is also configured to store predetermined RQL component metrics associated with each respective one of the predetermined RQL circuit design components 24. The RQL component metrics can include a variety of performance data, such as timing data and timing behavior, associated with each of the predetermined RQL circuit design components 24 under a variety of operating conditions. For example, the RQL component metrics can include performance data associated with at least one Josephson junction associated with the predetermined RQL circuit design components 24, behavioral response to both positive and negative SFQ pulses, and/or corner metrics associated with an amplitude range of at least one of a bias (e.g. a bias current) and a clock signal associated with the RQL circuit design 20. Therefore, the RQL component library 22 can store information that is pertinent to performance of each respective one of the predetermined RQL circuit design components in an individual manner.

The circuit simulator 16 includes the processor 18 and a performance metric compiler 26. The processor 18 can be a processor specific to the circuit simulator 16, or can be a processor that controls the RQL circuit simulation system 10. The performance metric compiler 26 can be configured to implement post-processing of simulation data that is provided from a circuit simulator (e.g., the circuit simulator 16) with respect to a circuit design (e.g., the RQL circuit design 20). For example, the performance metric compiler 26 is configured to access the RQL circuit design 20 from the memory system 14, as well as the access the predetermined RQL circuit design components 24 from the RQL component library 22, to compile performance metrics associated with the RQL circuit design 20 based on the RQL component metrics associated with each respective one of the predetermined RQL circuit design components 24 associated with the RQL circuit design 20. For example, the performance metric compiler 26 can be configured to evaluate the RQL circuit design 20 to identify the quantity and types of the predetermined RQL circuit design components 24 that constitute the RQL circuit design 20. Thus, upon determining the predetermined RQL circuit design components 24 that collectively form the RQL circuit design 20, the performance metric compiler 26 can access the RQL component metrics associated with each of the respective predetermined RQL circuit design components 24. Accordingly, the performance metric compiler 26 can compile aggregate performance metrics associated with the RQL circuit design 20 based on the individual performance metrics of each of the respective predetermined RQL circuit design components 24, in both quantity and type, that form the RQL circuit design 20. Alternatively, the predetermined RQL circuit design components 24 can be communicated automatically to the performance metric compiler 26 in response to generation of or saving of the RQL circuit design 20, such that the performance metric compiler 26 can compile aggregate performance metrics associated with the RQL circuit design 20 substantially automatically, such that the aggregate performance metrics can be saved in the memory system 14 along with the RQL circuit design 20.

Based on the aggregate performance metrics of the RQL circuit design 20, the processor 18 can be configured to simulate the RQL circuit design 20. The simulation of the RQL circuit design 20 can be based on the aggregate performance metrics, such that the simulation of the RQL circuit design 20 can test operational and behavioral characteristics of the RQL circuit design 20. For example, the simulation of the RQL circuit design 20 can be implemented to test performance of the RQL circuit design 20 and/or can indicate logic failures associated with the operation of the RQL circuit design 20, such as based on the design parameters and/or the peripheral operational parameters of the RQL circuit design 20. In the example of FIG. 1, the simulation results of the simulation can be communicated from the circuit simulator 16 back to the circuit design tool 12 to provide the simulation results in a useful format to one or more respective users. As a result, the user(s) can implement the circuit design tool 12 to modify the RQL circuit design 20 in a feedback manner, such as in real-time, to optimize the RQL circuit design 20. Therefore, the user(s) can monitor the effects of changes to RQL circuit design 20 in substantial real-time to facilitate changes to the RQL circuit design 20 to yield desired results.

In addition, in the example of FIG. 1, the circuit simulator 16 also includes a circuit metric calculator 28. As described earlier, the circuit design tool 12 can be configured to design an RQL circuit design component 24, such that the RQL circuit design component 24 designed via the circuit design tool 12 can be stored in the RQL component library 22 in the memory system 14. The circuit metric calculator 28 can be configured to calculate the RQL component metrics associated with the RQL circuit design component 24 that is designed via the circuit design tool 12. For example, the circuit design tool 12 can be implemented to provide a predetermined set of test parameters, such as via the circuit simulator 16, on the designed RQL circuit design component 24 based on the type of RQL circuit design component 24 (e.g., a JTL circuit system or an RQL gate circuit system). Thus, the circuit metric calculator 28 can calculate the RQL component metrics of the RQL circuit design component 24 with respect to the behavior of the RQL circuit design component 24 in response to the predetermined set of test parameters. Accordingly, the circuit metric calculator 28 can save the RQL component metrics of the respective RQL circuit design component 24 in the RQL component library 22 with the respective RQL circuit design component 24. As a result, the performance metric compiler 26 can later access the predetermined RQL circuit design component 24 to determine the respective RQL component metrics of the respective predetermined RQL circuit design component 24 to compile the performance metrics of an associated RQL circuit design 20 that includes the respective RQL circuit design component 24.

Figure 2:
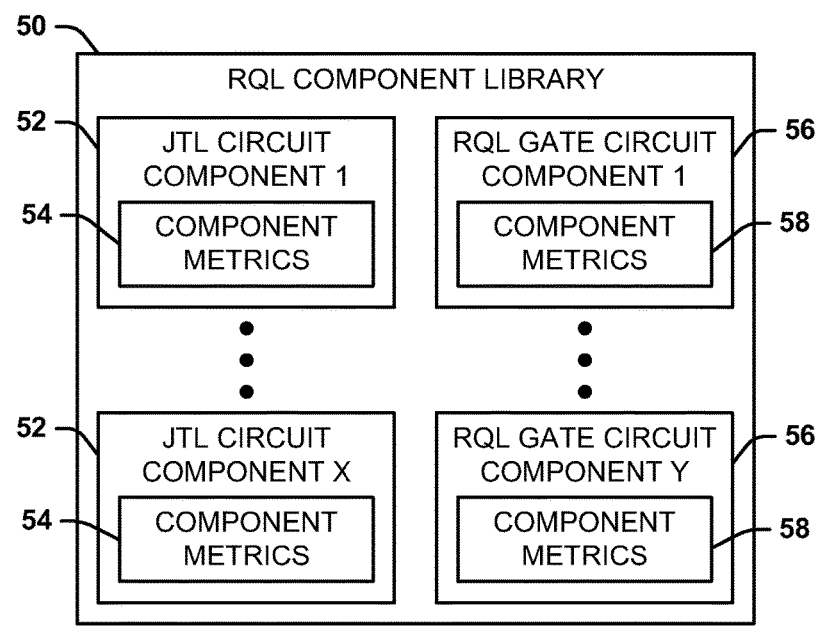
FIG. 2 illustrates an example of an RQL component library.

FIG. 2 illustrates an example of an RQL component library 50. The RQL component library 50 can correspond to the RQL component library 22 in the example of FIG. 1. Therefore, reference is to be made to the example of FIG. 1 in the following description of the example of FIG. 2.

The RQL component library 50 includes a plurality X of JTL circuit components 52, where X is a positive integer, that forms a first subset of the predetermined RQL circuit design components stored in the RQL component library 50 (e.g., corresponding to the predetermined RQL circuit design components 24 in the example of FIG. 1). The JTL circuit components 52 can each correspond to different types of JTL circuits that are each unique with respect to each other. As an example, the JTL circuit components 52 can correspond to different combinations of Josephson junctions, nodal junctions between and including sets of Josephson junctions, flux-shuttles, and/or a variety of other combinations of the Josephson junctions for propagating positive and/or negative SFQ pulses between devices (e.g., RQL gate circuit devices) in a given RQL circuit (e.g., the RQL circuit design 20). Each of the JTL circuit components 52 includes a set of RQL component metrics 54 that are associated with the behavioral and/or timing characteristics of the respective JTL circuit components 52. For example, the behavioral and/or timing characteristics can correspond to performance data associated with at least one Josephson junction associated with the respective JTL circuit component 52, behavioral response to both positive and negative SFQ pulses, and/or corner metrics associated with an amplitude range of at least one of a bias (e.g., bias current) and a clock signal based on which the respective JTL circuit component 52 can operate.

The RQL component library 50 includes a plurality Y of RQL gate circuit components 56, where Y is a positive integer, that forms a second subset of the predetermined RQL circuit design components stored in the RQL component library 50 (e.g., corresponding to the predetermined RQL circuit design components 24 in the example of FIG. 1). The RQL gate circuit components 56 can each correspond to different types of RQL logic gates and/or devices that are each unique with respect to each other. As an example, the RQL gate circuit components 56 can correspond to different types of variable resonators (e.g., qubits), superconducting quantum interference devices (SQUIDs), arrangements of Josephson junctions, and/or a variety of other combinations of circuit devices for performing logic operations based on positive and/or negative SFQ pulses provided from and to JTLs (e.g., JTL circuit components 52) in a given RQL circuit (e.g., the RQL circuit design 20). Each of the RQL gate circuit components 56 includes a set of RQL component metrics 58 that are associated with the behavioral and/or timing characteristics of the respective RQL gate circuit components 58. For example, the behavioral and/or timing characteristics can correspond to performance data associated with at least one Josephson junction associated with the respective RQL gate circuit component 52, behavioral response to both positive and negative SFQ pulses, and/or corner metrics associated with an amplitude range of at least one of a bias current and a clock signal based on which the respective RQL gate circuit component 52 can operate.

The RQL component metrics 54 and 58 can be calculated by the component metric calculator 28, such as in response to design of the respective JTL circuit components 52 and RQL gate circuit components 56. As an example, a given JTL circuit component 52 can be provided to the circuit simulator 16. JTL circuit components 52 that are designated as input JTLs can be driven by a conditioned SFQ pulse that is generated by a voltage source that can simulate a switching junction. JTL circuit components 52 that are designated as output JTLs can be terminated with a resistor that is approximately equal to an adequate shunt resistance. The behavior of all of the Josephson junctions of the JTL circuit components 52 can be monitored and evaluated based on a specific set of defined metrics, such as described in greater detail herein. Additionally, the JTL circuit components 52 can be tested based on a predetermined set of criteria to determine logical success or failure of the JTL circuit components 52. As an example, the JTL circuit components 52 can be implemented in a test environment in which an SFQ pulse is propagated through a predetermined number of Josephson junctions, such as at an extreme input time (e.g., 45°) based on a clock signal, and monitored to determine if there is a logical failure. Furthermore, Josephson junctions in the JTL circuit components 52 can be evaluated to extract input times of an SFQ pulse at the respective Josephson junctions, and thus also a delay from one Josephson junction to a next in a given JTL circuit component 52.

As another example, a given RQL gate circuit component 56 can likewise be provided to the circuit simulator 16 to calculate the RQL component metrics 58. The RQL gate circuit component 56 can be arranged between predetermined JTL circuits or a single input Josephson junction and a single output Josephson junction, and can be coupled to a bias cell in the simulation environment provided by the circuit simulator 16. Inductance values associated with the RQL gate circuit component 56 can be replaced with variables that can be unique to a given inductor associated with a respective bias arrangement (e.g., based on the bias cell) and/or the RQL gate circuit component 56, and critical current density associated with the Josephson junctions therein can be changed to variables. Thus, the behavior of the RQL gate circuit component 56 can be tested in the simulated environment to calculate the RQL component metrics associated with the respective RQL gate component 56. For example, an SFQ pulse delay (e.g., positive and negative) can be calculated based on a timing difference between the switching of an input Josephson junction relative to the switching of a first Josephson junction at an output of the RQL gate circuit component 56. As another example, a pass/fail analysis can be conducted for a given RQL gate circuit component 56 based on providing an input time of approximately 90° with respect to a clock signal phase, such that the input time is late enough in the phase of the clock signal to fail while still allowing some time for propagation of the respective SFQ pulses through associated JTLs (e.g., at the input and/or output of the RQL gate circuit component 56).

Additionally, for both the JTL circuit components 52 and the RQL gate circuit components 56, the test parameters can be variably adjusted, such that corner metrics associated with the changes to the test parameters can be calculated and saved as part of the respective RQL component metrics 54 and 58. For example, the circuit metric calculator 28 can be configured to sweep across a range of amplitudes associated with external factors, such as an AC clock bias current and/or a DC flux bias current, and/or a range of amplitudes associated with fabrication parameters, such as a global inductance and/or a critical current density. As an example, the circuit metric calculator 28 can hold a given one or more of the test parameters at a constant nominal magnitude, such as but not limited to the target operating value of the parameters, to determine the operational behavior of the JTL circuit components 52 and/or the RQL gate circuit components 56. Additionally, the corner metrics can include ranges of the test parameters at which logical failure can occur for the respective JTL circuit components 52 and the RQL gate circuit components 56. Thus, the corner metrics data can be included as part of the respective RQL component metrics 54 and 58, such that the simulator circuit 16 can facilitate simulation of the RQL circuit design 20 that includes the respective JTL circuit components 52 and the RQL gate circuit components 56 based additionally on the corner metrics.

Figure 3:
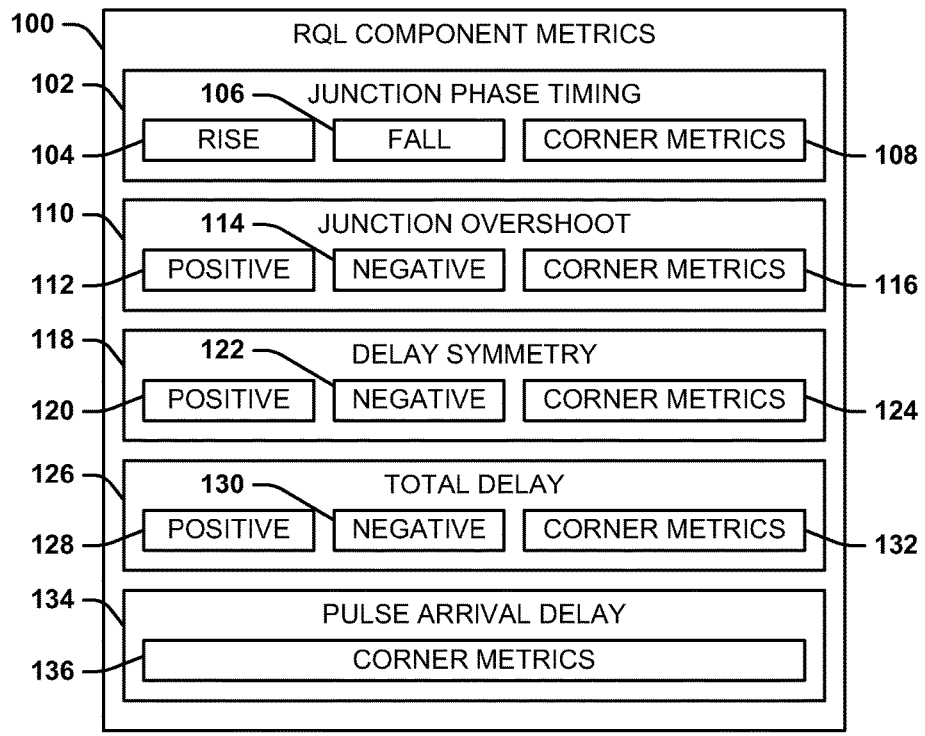
FIG. 3 illustrates an example of an RQL component metrics file.

FIG. 3 illustrates an example of an RQL component metrics file 100. The RQL component metrics file 100 can correspond to a software file that is stored in the RQL component library 22 in the example of FIG. 1, and can be associated with a respective one of the predetermined RQL circuit design components 24 to describe the behavioral and/or timing characteristics of the respective predetermined RQL circuit design component 24. For example, the RQL component metrics file 100 can correspond to the RQL component metrics 54 associated with one of the JTL circuit components 52 or the RQL component metrics 58 associated with one of the RQL gate circuit components 56. Therefore, reference is to be made to the examples of FIGS. 1 and 2 in the following description of the example of FIG. 3.

In the example of FIG. 3, the RQL component metrics file 100 includes a junction phase timing metric 102 corresponding to a time for a phase shift of one or more Josephson junctions in the respective predetermined RQL circuit design component. For example, the junction phase timing metric 102 can include a risetime of the Josepson junction(s) from 0 to $2\pi$, demonstrated at 104, and a falltime of the Josephson junction(s) from $2\pi$ to 0, demonstrated at 106. The junction phase timing metric 102 also includes corner metrics 108 that can include an effect of variations in test parameters (e.g., bias current amplitude and/or clock signal amplitude) on the rise time 104 and/or the fall time 106 associated with the phase changes of the respective Josephson junction(s).

The RQL component metrics file 100 also includes a junction overshoot metric 110 corresponding to characteristics of overshoot exhibited by the one or more Josephson junctions in the respective predetermined RQL circuit design component, such as corresponding to a time and a magnitude of phase overshoot in response to an SFQ pulse. For example, the junction overshoot metric 110 can include overshoot characteristics associated with a positive SFQ pulse, demonstrated at 112, and overshoot characteristics associated with a negative SFQ pulse, demonstrated at 114. The junction overshoot metric 110 also includes corner metrics 116 that can include an effect of variations in test parameters (e.g., bias current amplitude and/or clock signal amplitude) on the overshoot characteristics of the respective Josephson junction(s) in response to the positive and negative SFQ pulses.

The RQL component metrics file 100 also includes a delay symmetry metric 118 corresponding to a gate delay symmetry between positive and negative SFQ pulses at separate respective inputs of the respective predetermined RQL circuit design component (e.g., an RQL gate circuit component). For example, the delay symmetry metric 118 can include an acceptable delay time associated with receipt of positive SFQ pulses at respective inputs, demonstrated at 120, and an acceptable delay time associated with receipt of negative SFQ pulses at respective inputs, demonstrated at 122. Therefore, the delay symmetry metric 118 can define ranges of delay times of the positive and negative SFQ pulses 120 and 122 for acceptable operation of the predetermined RQL circuit design component, and thus likewise can also define unacceptable delay symmetry times that can result in a logical failure of the predetermined RQL circuit design component. The delay symmetry metric 118 also includes corner metrics 120 that can include an effect of variations in test parameters (e.g., bias current amplitude and/or clock signal amplitude) on the gate delay symmetry times associated with the positive and negative SFQ pulses.

The RQL component metrics file 100 also includes a total delay metric 124 corresponding to a total delay of SFQ pulses through the predetermined RQL circuit design component (e.g., through the respective JTL circuit component 52 and/or the respective RQL gate circuit components 56). For example, the total delay metric 124 can include a total delay time associated with propagation of a positive SFQ pulse through the respective predetermined RQL circuit design component, demonstrated at 126, and a total delay time associated with propagation of a negative SFQ pulse through the respective predetermined RQL circuit design component, demonstrated at 128. The total delay metric 124 also includes corner metrics 130 that can include an effect of variations in test parameters (e.g., bias current amplitude and/or clock signal amplitude) on the total delay times associated with the positive SFQ pulses 126 and the negative SFQ pulses 128.

The RQL component metrics file 100 also includes a delay symmetry metric 132 corresponding to a gate delay symmetry between positive and negative SFQ pulses. The delay symmetry metric 132 can thus include data associated with a range of times for acceptable operation of the predetermined RQL circuit design component based on a delay between being provided respective positive and negative SFQ pulses, and thus likewise also defining unacceptable delay times that can result in a logical failure of the predetermined RQL circuit design component. The delay symmetry metric 132 also includes corner metrics 134 that can include an effect of variations in test parameters (e.g., bias current amplitude and/or clock signal amplitude) on the gate delay times associated with the positive and negative SFQ pulses.

It is to be understood that the RQL component metrics file 100 is not limited to the example of FIG. 3. As an example, the RQL component metrics file 100 can include more or less metrics associated with the Josephson junctions and timing behavior with respect to positive and/or negative SFQ pulses. Therefore, the RQL component metrics file 100 is provided as but one example of a set of metrics that can define the timing behavior of a respective predetermined RQL circuit design component, such that the set of metrics can be compiled to determine aggregate performance metrics of an associated RQL circuit design 20.

Figure 4:
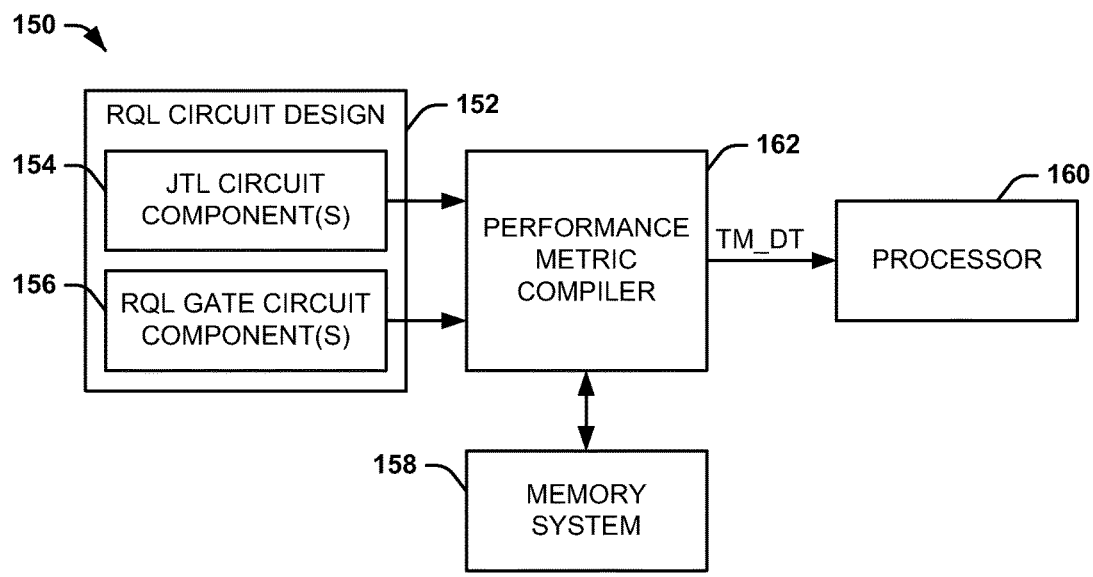
FIG. 4 illustrates another example of an RQL circuit simulation system.

FIG. 4 illustrates another example of an RQL circuit simulation system 150. The RQL circuit simulation system 150 can correspond to a portion of the RQL circuit simulation system 10 in the example of FIG. 1. In the example of FIG. 4, a circuit design tool (e.g., the circuit design tool 12) can be configured to facilitate user inputs to design an RQL circuit design 152, such as can be stored in a memory system (e.g., the memory system 14). The RQL circuit design 152 can correspond to a collection of quantum computing components and a collection of classical computing components with which the quantum computing components can interact. In the example of FIG. 4, the RQL circuit design 152 includes one or more JTL circuit components 154 and one or more RQL gate circuit components 156, such as corresponding to the predetermined RQL circuit design components 24 in the example of FIG. 1 (e.g., corresponding to the JTL circuit components 52 and the RQL gate circuit components 56, respectively, in the example of FIG. 2).

The RQL circuit simulation system 150 can be configured to simulate operation of the RQL circuit design 152, such as via the circuit simulator 16 in the example of FIG. 1. As an example, the JTL circuit component(s) 154 and the RQL gate circuit component(s) 156 can be stored as respective predetermined RQL circuit design components in an RQL component library in a memory system 158. Therefore, the respective circuit design tool can be implemented to selectively design the RQL circuit design 152 based on the respective predetermined RQL circuit design components stored therein, including the JTL circuit component(s) 154 and the RQL gate circuit component(s) 156. Similar to as described previously, each of the JTL circuit component(s) 154 and the RQL gate circuit component(s) 156 can have an associated respective RQL component metrics file stored in the memory system 158. As an example, the associated respective RQL component metrics files associated with each of the JTL circuit component(s) 154 and the RQL gate circuit component(s) 156 can be arranged substantially similar to the RQL component metrics file 100 in the example of FIG. 3. Thus, the RQL component metrics files can each include a variety of performance data, such as timing data and timing behavior, associated with each of the JTL circuit component(s) 154 and the RQL gate circuit component(s) 156 in the RQL circuit design 152 under a variety of operating conditions.

The RQL circuit simulation system 150 also includes a processor 160 and a performance metric compiler 162. In the example of FIG. 4, in response to initiation of a simulation or during design of the RQL circuit design 152 (e.g., via the circuit design tool 12), the performance metric compiler 162 is configured to access each of the JTL circuit component(s) 154 and the RQL gate circuit component(s) 156 from the RQL component library in the memory system 158 to compile performance metrics associated with the RQL circuit design 152 based on the RQL component metrics associated with each respective one of the JTL circuit component(s) 154 and the RQL gate circuit component(s) 156. For example, the performance metric compiler 162 can be configured to evaluate the RQL circuit design 152 to identify the quantity and types of each of the JTL circuit component(s) 154 and the RQL gate circuit component(s) 156 that constitute the RQL circuit design 152. Thus, the performance metric compiler 162 can compile aggregate performance metrics associated with the RQL circuit design 152 based on the individual performance metrics each of the JTL circuit component(s) 154 and the RQL gate circuit component(s) 156. In the example of FIG. 4, the aggregate performance metrics are provided to the processor 160 as a signal TM_DT, such that the processor 160 can simulate the RQL circuit design 152 based on the aggregate performance metrics of the RQL circuit design 152.

Accordingly, the RQL circuit design 152 can be simulated based on the aggregate performance metrics to test operational and behavioral characteristics of the RQL circuit design 152. For example, the simulation of the RQL circuit design 152 can be implemented to test performance of the RQL circuit design 152 and/or can indicate logic failures associated with the operation of the RQL circuit design 152, such as based on the design parameters and/or the peripheral operational parameters of the RQL circuit design 152. In the example of FIG. 4, the simulation results of the simulation can be communicated from the circuit simulator 156 back to a respective circuit design tool to provide the simulation results in a useful format to one or more respective users. As a result, the user(s) can implement the circuit design tool to modify the RQL circuit design 152 in a feedback manner, such as in real-time, to optimize the RQL circuit design 152. Therefore, the user(s) can monitor the effects of changes to RQL circuit design 152 in substantial real-time to facilitate changes to the RQL circuit design 152 to yield desired results.

Figure 5:
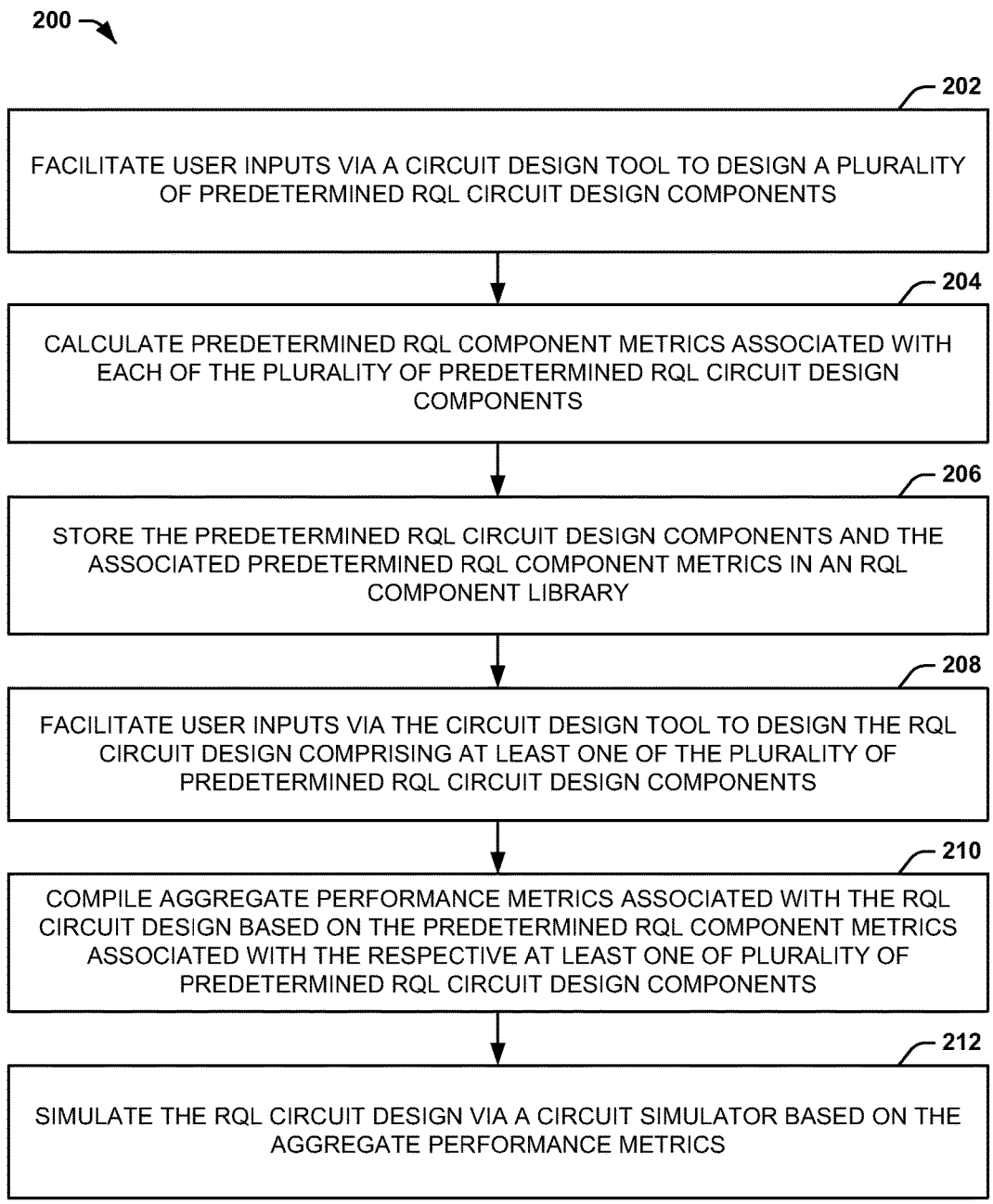
FIG. 5 illustrates an example of a method for simulating an RQL circuit.

In view of the foregoing structural and functional features described above, a methodology in accordance with various aspects of the present invention will be better appreciated with reference to FIG. 5. While, for purposes of simplicity of explanation, the methodology of FIG. 5 is shown and described as executing serially, it is to be understood and appreciated that the present invention is not limited by the illustrated order, as some aspects could, in accordance with the present invention, occur in different orders and/or concurrently with other aspects from that shown and described herein. Moreover, not all illustrated features may be required to implement a methodology in accordance with an aspect of the present invention.

FIG. 5 illustrates an example of a method 200 for simulating an RQL circuit design (e.g., the RQL circuit design 20). At 202, user inputs are facilitated via a circuit design tool (e.g., the circuit design tool 12) to design a plurality of predetermined RQL circuit design components (e.g., the predetermined RQL circuit design components 24). At 204, predetermined RQL component metrics (e.g., stored in the RQL component metric file 100) associated with each of the plurality of predetermined RQL circuit design components are calculated. At 206, the predetermined RQL circuit design components and the associated predetermined RQL component metrics are stored in an RQL component library (e.g., the RQL component library 22). At 208, user inputs are facilitated via the circuit design tool to design the RQL circuit design comprising at least one of the plurality of predetermined RQL circuit design components. At 210, aggregate performance metrics (e.g., the aggregate performance metrics TM_DT) associated with the RQL circuit design are compiled (e.g., via the performance metric compiler 26) based on the predetermined RQL component metrics associated with the respective at least one of plurality of predetermined RQL circuit design components. At 212, the RQL circuit design is simulated via a circuit simulator (e.g., the circuit simulator 16) based on the aggregate performance metrics.

In view of the foregoing structural and functional description, those skilled in the art will appreciate that portions of the systems and method disclosed herein may be embodied as a method, data processing system, or computer program product such as a non-transitory computer readable medium. Accordingly, these portions of the approach disclosed herein may take the form of an entirely hardware embodiment, an entirely software embodiment (e.g., in a non-transitory machine readable medium), or an embodiment combining software and hardware. Furthermore, portions of the systems and method disclosed herein may be a computer program product on a computer-usable storage medium having computer readable program code on the medium. Any suitable computer-readable medium may be utilized including, but not limited to, static and dynamic storage devices, hard disks, optical storage devices, and magnetic storage devices.

Certain embodiments have also been described herein with reference to block illustrations of methods, systems, and computer program products. It will be understood that blocks of the illustrations, and combinations of blocks in the illustrations, can be implemented by computer-executable instructions. These computer-executable instructions may be provided to one or more processors of a general purpose computer, special purpose computer, or other programmable data processing apparatus (or a combination of devices and circuits) to produce a machine, such that the instructions, which execute via the one or more processors, implement the functions specified in the block or blocks.

These computer-executable instructions may also be stored in computer-readable memory that can direct a computer or other programmable data processing apparatus to function in a particular manner, such that the instructions stored in the computer-readable memory result in an article of manufacture including instructions which implement the function specified in the flowchart block or blocks. The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide steps for implementing the functions specified in the flowchart block or blocks.

What have been described above are examples of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims.

What is claimed is:

1. A Reciprocal Quantum Logic (RQL) circuit simulation system comprising:
    a circuit design tool configured to facilitate user inputs to design an RQL circuit design comprising at least one predetermined RQL circuit design component, and to facilitate the user inputs to design a respective one of the predetermined RQL circuit design components;
    a memory system configured to store the RQL circuit design and an RQL component library comprising a plurality of predetermined RQL circuit design components from which the at least one predetermined RQL circuit design component is selected, each of the plurality of predetermined RQL circuit design components comprising predetermined RQL component metrics associated with performance of the respective one of the plurality of predetermined RQL circuit design components; and
    a circuit simulator comprising a circuit metric calculator configured to calculate the predetermined RQL component metrics associated with the respective one of the predetermined RQL circuit design components and to store the respective one of the predetermined RQL circuit design components and the associated predetermined RQL component metrics in the RQL component library, the circuit simulator configured to compile performance metrics associated with the RQL circuit design based on the predetermined RQL component metrics associated with the respective at least one of plurality of predetermined RQL circuit design components and to simulate the RQL circuit design based on the performance metrics to determine an RQL circuit to be fabricated from the RQL circuit design based on the simulation.

2. The system of claim 1, wherein the plurality of predetermined RQL circuit design components comprises at least one of a plurality of Josephson transmission line (JTL) circuit components and a plurality of RQL gate circuit components.

3. The system of claim 1, wherein the predetermined RQL component metrics associated with each of the plurality of predetermined RQL circuit design components comprises timing data associated with at least one Josephson junction associated with the respective one of the plurality of predetermined RQL circuit design components.

4. The system of claim 3, wherein the predetermined RQL component metrics associated with each of the plurality of RQL gate circuit components comprises at least one of junction phase timing associated with the at least one Josephson junction, junction overshoot associated with the at least one Josephson junction, delay symmetry of single flux quantum (SFQ) pulses associated with the respective one of the plurality of predetermined RQL circuit design components, total delay associated with the respective one of the plurality of predetermined RQL circuit design components, and a pulse arrival delay associated with the respective one of the plurality of predetermined RQL circuit design components.

5. The system of claim 1, wherein the predetermined RQL component metrics associated with each of the plurality of RQL gate circuit components comprises at least one of separate timing metrics associated with a rise time and a fall time of a single flux quantum (SFQ) pulse and separate timing metrics associated with positive and negative SFQ pulses.

6. The system of claim 1, wherein the predetermined RQL component metrics associated with each of the plurality of RQL gate circuit components comprises corner metrics associated with an amplitude range of at least one of a bias current and a clock signal associated with the respective one of the plurality of predetermined RQL circuit design components.

7. The system of claim 1, wherein the circuit simulator comprises:
a performance metric compiler configured to evaluate the RQL circuit design and to access the RQL component library to compile aggregate performance metrics associated with the associated with the RQL circuit design based on the predetermined RQL component metrics associated with each individual one of the respective at least one of plurality of predetermined RQL circuit design components; and
a processor configured to simulate the RQL circuit design based on the aggregate performance metrics.

8. The system of claim 7, wherein the processor is configured to communicate simulation results associated with the simulated RQL circuit design to the circuit design tool to facilitate the user inputs to optimize the RQL circuit design in a feedback manner.

9. A non-transitory computer readable medium configured to store instructions that, when executed, are configured to perform a method for simulating a Reciprocal Quantum Logic (RQL) circuit design, the method comprising:
facilitating user inputs via a circuit design tool to design a plurality of predetermined RQL circuit design components;
calculating predetermined RQL component metrics associated with each of the plurality of predetermined RQL circuit design components, the calculating comprising calculating at least one of separate timing metrics associated with a rise time and a fall time of a single flux quantum (SFQ) pulse and separate timing metrics associated with positive and negative SFQ pulses;
storing the predetermined RQL circuit design components and the associated predetermined RQL component metrics in an RQL component library;
facilitating user inputs via the circuit design tool to design the RQL circuit design comprising at least one of the plurality of predetermined RQL circuit design components;
compiling aggregate performance metrics associated with the RQL circuit design based on the predetermined RQL component metrics associated with the respective at least one of plurality of predetermined RQL circuit design components;
simulating the RQL circuit design via a circuit simulator based on the aggregate performance metrics to determine an RQL circuit to be fabricated from the RQL circuit design based on the simulation.

10. The medium of claim 9, wherein facilitating the user inputs via the circuit design tool to design a plurality of predetermined RQL circuit design components comprises facilitating the user inputs via the circuit design tool to design at least one of a plurality of Josephson transmission line (JTL) circuit components and a plurality of RQL gate circuit components.

11. The medium of claim 9, wherein calculating the predetermined RQL component metrics further comprises calculating timing data associated with at least one Josephson junction associated with the respective one of the plurality of predetermined RQL circuit design components.

12. The medium of claim 11, wherein calculating the predetermined RQL component metrics further comprises calculating at least one of junction phase timing associated with the at least one Josephson junction, junction overshoot associated with the at least one Josephson junction, delay symmetry of single flux quantum (SFQ) pulses associated with the respective one of the plurality of predetermined RQL circuit design components, total delay associated with the respective one of the plurality of predetermined RQL circuit design components, and a pulse arrival delay associated with the respective one of the plurality of predetermined RQL circuit design components.

13. The medium of claim 9, wherein calculating the predetermined RQL component metrics further comprises calculating corner metrics associated with an amplitude range of at least one of a bias current and a clock signal associated with the respective one of the plurality of predetermined RQL circuit design components.

14. The medium of claim 9, further comprising:
communicating simulation results associated with the simulated RQL circuit design to the circuit design tool; and
facilitating the user inputs to optimize the RQL circuit design in a feedback manner.

15. A Reciprocal Quantum Logic (RQL) circuit simulation system comprising:
a circuit design tool configured to facilitate user inputs to design an RQL circuit design comprising at least one predetermined RQL circuit design component;
a memory system configured to store the RQL circuit design and an RQL component library comprising a plurality of predetermined RQL circuit design components from which the at least one predetermined RQL circuit design component is selected, each of the plurality of predetermined RQL circuit design components comprising predetermined RQL component metrics, the predetermined RQL component metrics comprising timing data associated with at least one Josephson junction and timing behavior associated with single-flux quantum (SFQ) pulses associated with the respective one of the plurality of predetermined RQL circuit design components; and a circuit simulator comprising:
- a performance metric compiler configured to evaluate the RQL circuit design and to access the RQL component library to compile aggregate performance metrics associated with the associated with the RQL circuit design based on the predetermined RQL component metrics associated with each individual one of the respective at least one of plurality of predetermined RQL circuit design components; and
- a processor configured to simulate the RQL circuit design based on the aggregate performance metrics to determine an RQL circuit to be fabricated from the RQL circuit design based on the simulation.

16. The system of claim 15, wherein the circuit design tool is further configured to facilitate the user inputs to design a respective one of the predetermined RQL circuit design components, wherein the circuit simulator comprises a circuit metric calculator configured to calculate the predetermined RQL component metrics associated with the respective one of the predetermined RQL circuit design components and to store the respective one of the predetermined RQL circuit design components and the associated predetermined RQL component metrics in the RQL component library.

17. The system of claim 15, wherein the plurality of predetermined RQL circuit design components comprises at least one of a plurality of Josephson transmission line (JTL) circuit components and a plurality of RQL gate circuit components.

18. The system of claim 15, wherein the processor is configured to communicate simulation results associated with the simulated RQL circuit design to the circuit design tool to facilitate the user inputs to optimize the RQL circuit design in a feedback manner.

* * * * *